United States Patent
Lin et al.

(10) Patent No.: US 8,234,003 B2
(45) Date of Patent: Jul. 31, 2012

(54) MONITORING CIRCUIT, MONITORING DEVICE AND MONITORING METHOD THEREOF

(75) Inventors: Wen-Yung Lin, Taichung County (TW); I-Fang Chou, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 701 days.

(21) Appl. No.: 12/356,118

(22) Filed: Jan. 20, 2009

(65) Prior Publication Data

US 2010/0185305 A1  Jul. 22, 2010

(51) Int. Cl.
*G06F 19/00* (2011.01)

(52) U.S. Cl. .................. 700/121; 700/112; 700/228

(58) Field of Classification Search .............. 700/22, 700/112, 113, 121, 228, 245
See application file for complete search history.

(56) References Cited

U.S. PATENT DOCUMENTS

| | | | |
|---|---|---|---|
| 6,188,323 B1 * | 2/2001 | Rosenquist et al. | 340/686.5 |
| 2003/0023454 A1 * | 1/2003 | Aiuchi et al. | 705/1 |
| 2005/0010311 A1 * | 1/2005 | Barbazette et al. | 700/78 |
| 2006/0217841 A1 * | 9/2006 | Matsumoto et al. | 700/248 |

* cited by examiner

*Primary Examiner* — Kakali Chaki
*Assistant Examiner* — Nathan Laughlin
(74) *Attorney, Agent, or Firm* — Thomas|Kayden

(57) ABSTRACT

A monitoring device for monitoring an abnormal load or unload operation of a wafer. The monitoring device includes a sensing unit and a detective unit. The sensing unit is for providing a sensing information, which indicates whether the wafer protrudes from a side of a carrier. The detective unit is for determining whether a duration, for which the wafer protrudes from the side of the carrier exceeds a predetermined time, for which the wafer is loaded or unloaded, according to the sensing information. If the duration exceeds the predetermined time, the detective unit further triggers an abnormal event.

29 Claims, 5 Drawing Sheets

MONITORING CIRCUIT, MONITORING DEVICE AND MONITORING METHOD THEREOF

BACKGROUND OF THE INVENTION

1. Field of the Invention

The invention relates in general to a monitoring circuit, a monitoring device, and a monitoring method thereof, and more particularly to a monitoring circuit for monitoring whether a wafer is loaded or unloaded abnormally, a monitoring device for monitoring an abnormal load or unload operation of the wafer, and a monitoring method thereof.

2. Description of the Related Art

In the semiconductor manufacturing processes, a wafer is important for manufacturing semiconductor devices. The wafer is usually carried by a carrier. When the wafer is being processed, a manipulator unloads the wafer from the carrier, and transfers the wafer to a chamber for further processing. Thereafter, the manipulator loads the processed wafer to the carrier so as to complete the load and unload operation of the wafer.

When the manipulator loads or unloads the wafer, if the position of the wafer in the carrier is deviated from its proper position, the manipulator may fail in normally loading or unloading the wafer. Moreover, the wafer may be damaged undesirably. Thus, it is an important subject to prevent the wafer from being damaged when the wafer is loaded or unloaded.

SUMMARY OF THE INVENTION

The invention is directed to a monitoring circuit and device for monitoring an abnormal load or unload operation of a wafer, and a monitoring method thereof, wherein a sensing information is provided to indicate whether the wafer protrudes from one side of a carrier, and it is determined whether a duration, for which the wafer protrudes from the side of the carrier, exceeds a predetermined time according to the sensing information. Thus, an abnormal event may be triggered to indicate that an abnormal operation occurs when the transfer machine loads or unloads the wafer. Thus, it is also possible to stop the machine from loading or unloading the wafer in the abnormal event to prevent the wafer from being damaged.

According to a first aspect of the present invention, a monitoring device for monitoring an abnormal load or unload operation of a wafer. The monitoring device includes a sensing unit and a detective unit. The sensing unit provides a sensing information, which indicates whether the wafer protrudes from a side of a carrier or not. The detective unit determines whether a duration, for which the wafer protrudes from the side of the carrier, exceeds a predetermined time, for which the wafer is loaded or unloaded, according to the sensing information. If the duration exceeds the predetermined time, the detective unit further triggers an abnormal event.

According to a second aspect of the present invention, a monitoring circuit including a sensing unit and a detective unit is provided. The sensing unit provides a sensing information. The detective unit includes a first controlling unit, a setting unit, an operating unit, a driving unit and a second controlling unit. The first controlling unit receives a first detective voltage and a second detective voltage, and outputs one of the first detective voltage and the second detective voltage according to a voltage level of the sensing information. The setting unit stores a first storing voltage. When the first controlling unit outputs the first detective voltage, the setting unit receives the first detective voltage and increases a level of the first storing voltage. When the first controlling unit outputs the second detective voltage, the setting unit receives the second detective voltage and decreases the level of the first storing voltage. The operating unit selectively enables latching and provides a second storing voltage according to the level of the first storing voltage. The driving unit is controlled by the second storing voltage to provide a driving signal. The second controlling unit receives a third detective voltage, and selectively provides a warning signal, which has a voltage level of the third detective voltage, according to a voltage level of the driving signal. When the first storing voltage is higher than a threshold value, the operating unit enables the latching and provides the second storing voltage. The driving unit provides the driving signal having a high voltage level to drive the second controlling unit to enable the second controlling unit to provide the warning signal under control of the second storing voltage.

The invention will become apparent from the following detailed description of the preferred but non-limiting embodiments. The following description is made with reference to the accompanying drawings.

DETAILED DESCRIPTION OF THE INVENTION

Figure 1:
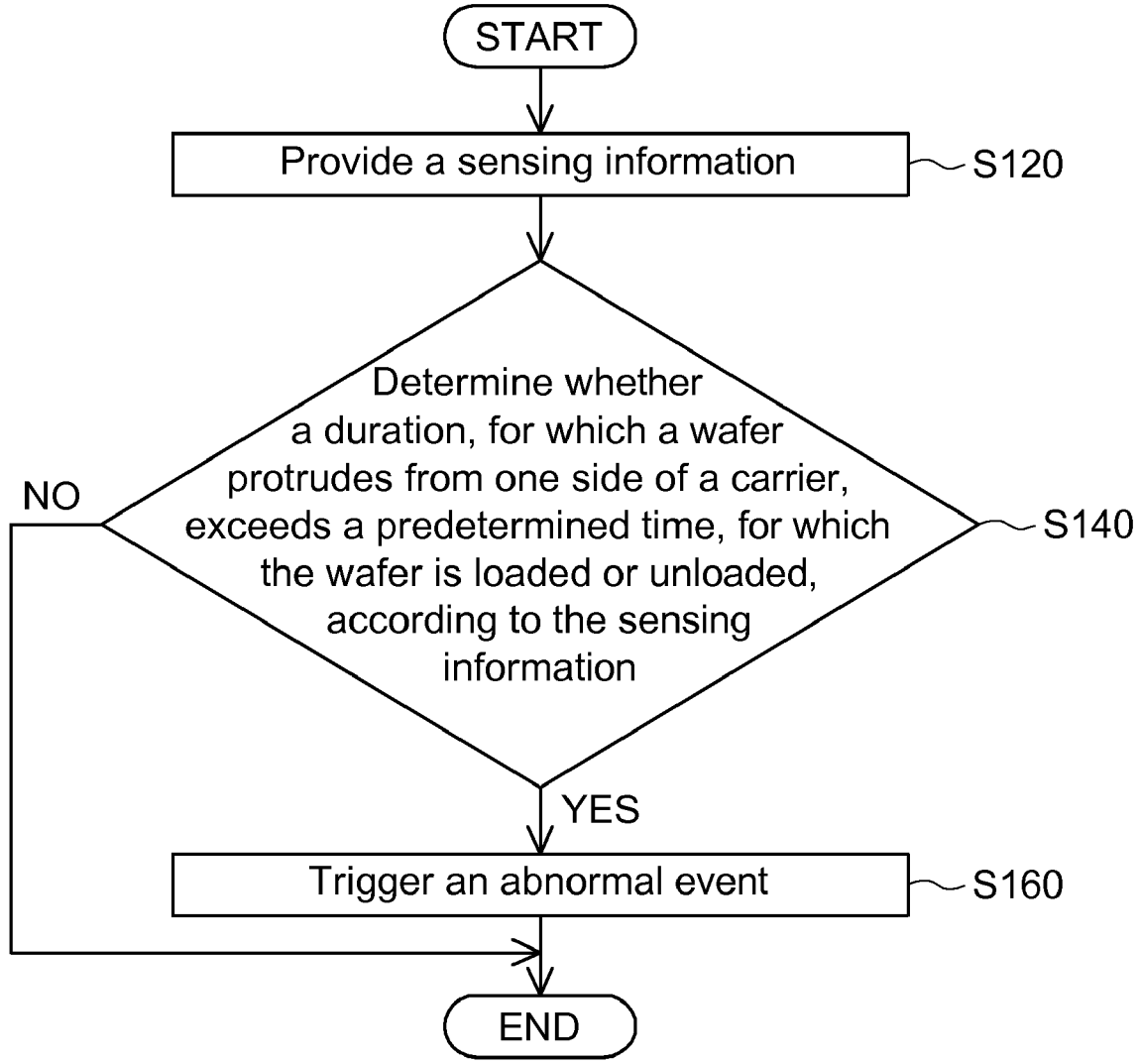
FIG. 1 is a flow chart showing a monitoring method according to an embodiment of the invention.

FIG. 1 is a flow chart showing a monitoring method according to an embodiment of the invention. Referring to FIG. 1, the monitoring method is for monitoring whether an abnormal operation occurs when a transfer machine loads or unloads a wafer from one side of a carrier. The monitoring method includes following steps. In step S120, a sensing information which indicates whether the wafer protrudes from the side of the carrier is provided. In step S140, it is determined whether a duration, for which the wafer protrudes from the side of the carrier, exceeds a predetermined time, for which the wafer is loaded or unloaded, according to the sensing information. If the duration exceeds the predetermined time, an abnormal event is triggered in step S160. A monitoring device which executes the monitoring method of the invention for monitoring an abnormal load or unload operation of the wafer will be described in the following.

Figure 2:
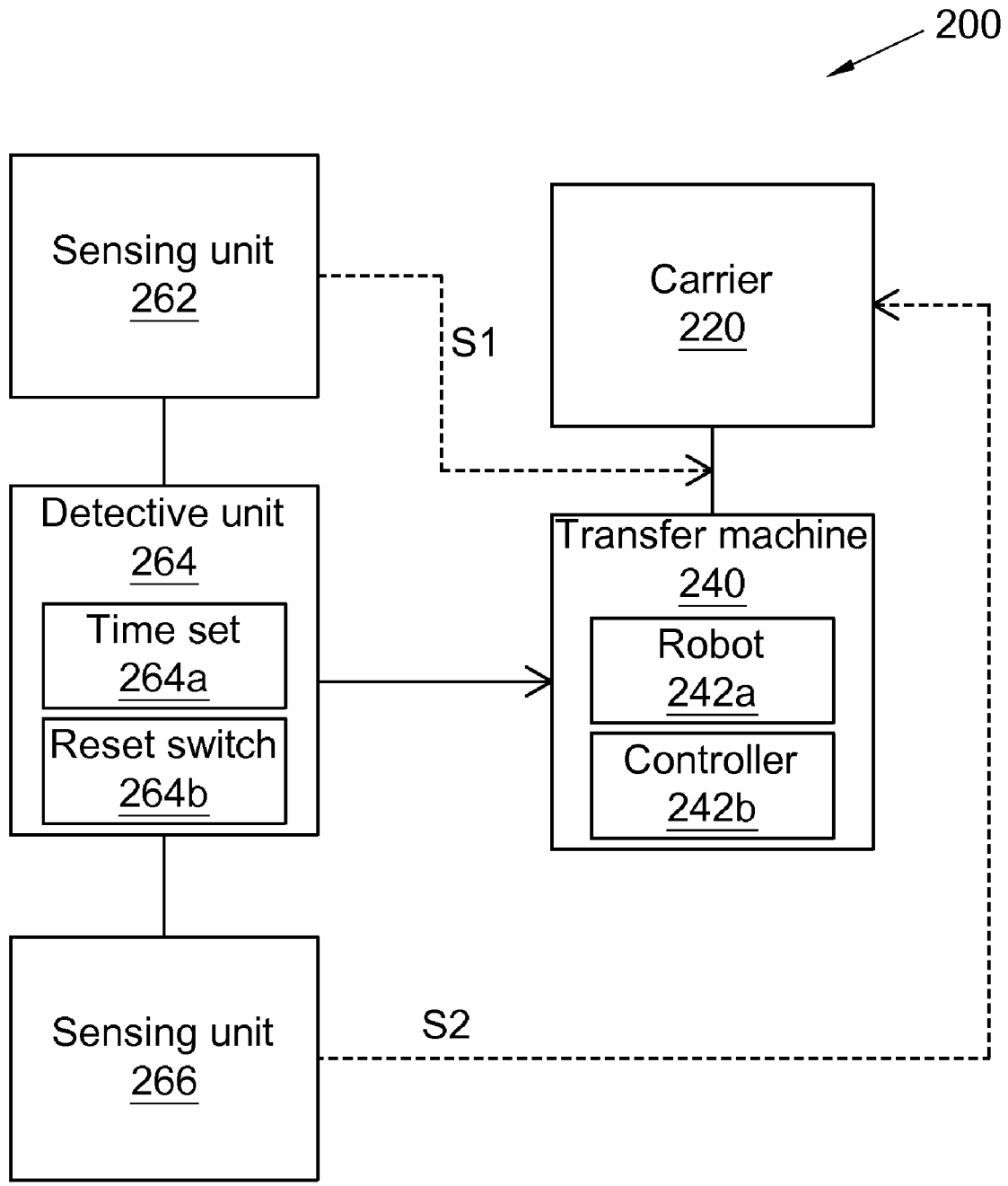
FIG. 2 is a block diagram showing a monitoring device for monitoring an abnormal load or unload operation of a wafer according to an embodiment of the invention.

FIG. 2 is a block diagram showing a monitoring device 200 for monitoring the abnormal load or unload operation of the wafer according to the embodiment of the invention. Referring to FIG. 2, the monitoring device 200 includes a sensing unit 262 and a detective unit 264, and is for monitoring whether the wafer in a carrier 220 is loaded or unloaded abnormally. The monitoring device 200 may also include a transfer machine 240 in an embodiment of this invention.

Figure 3A:
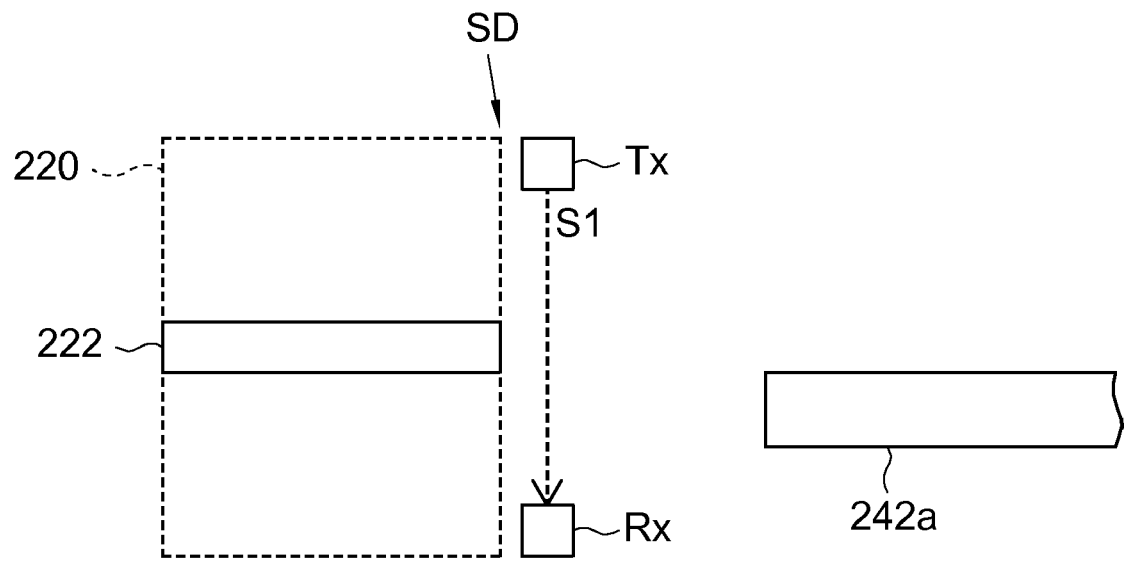
FIG. 3A is a side view showing one example of a carrier and the partial architecture of the monitoring device of FIG. 2.

FIG. 3A is a side view showing one example of the carrier 220 and the partial architecture of the monitoring device 200 of FIG. 2. Detailed description is provided as follows with reference to FIGS. 2 and 3A.

The carrier 220, such as a cassette table, carries a wafer 222. The wafer 222 is carried in one slot of the cassette table. The transfer machine 240 loads or unloads the wafer 222 from one side (e.g. a front side SD) of the carrier 220. In practice, the transfer machine 240 includes, for example, a robot 242a and a controller 242b. The robot 242a loads and unloads the wafer 222 under the control of the controller 242b. As shown in FIG. 3A, the robot 242a of the transfer machine 240 loads or unloads the wafer 222 from the front side SD of the carrier 220.

Figure 3B:
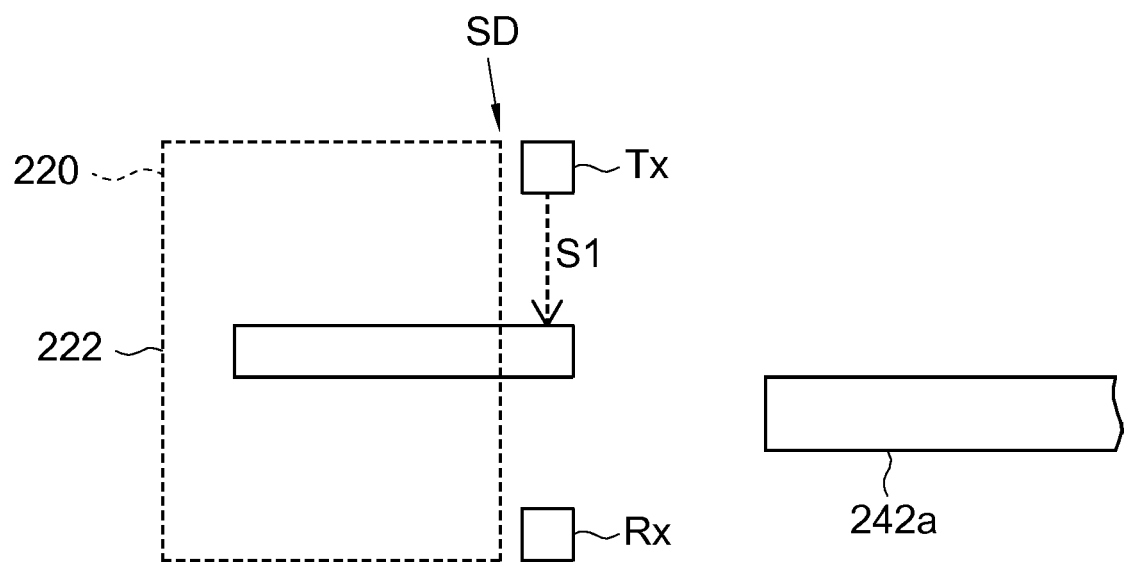
FIG. 3B is a side view showing that the wafer carried by the carrier of FIG. 3A protrudes from one side of the carrier.

The sensing unit 262 provides a sensing information, which is exemplified by a sensing signal S1, to indicate whether the wafer 222 protrudes from the front side SD of the carrier 220. For example, FIG. 3B is a side view showing that the wafer 222 carried by the carrier 220 of FIG. 3A protrudes from the front side SD of the carrier 220. Referring to FIGS. 3A and 3B, the sensing unit 262 includes, for example, a transmitter Tx and a receiver Rx, and is disposed on the front side SD of the carrier 220. The transmitter Tx transmits the sensing signal S1 to the receiver Rx. The detective unit 264 determines whether the wafer 222 protrudes from the front side SD of the carrier 220 according to the state of the sensing signal S1.

That is, in the example mentioned hereinabove, when the receiver Rx receives the sensing signal S1, the sensing signal S1 is not blocked and a first voltage level is measured. At this time, the detective unit 264 can obtain that the wafer 222 does not protrude from the front side SD of the carrier 220 according to the sensing signal S1 having the first voltage level, as shown in FIG. 3A. Correspondingly, when the receiver Rx fails in receiving the sensing signal S1, the sensing signal S1 is blocked and a second voltage level is measured. At this time, the detective unit 264 obtains that the wafer 222 may protrude from the front side SD of the carrier 220 according to the sensing signal S1 having the second voltage level, as shown in FIG. 3B. Thus, the detective unit 264 can determine whether the wafer 222 protrudes from the front side SD of the carrier 220 according to the level of the sensing signal S1 (e.g., the first voltage level or the second voltage level).

When the detective unit 264 determines that the wafer 222 protrudes from the front side SD of the carrier 220 according to the sensing signal S1, the detective unit 264 further determines that whether the duration, for which the wafer 222 protrudes from the front side SD of the carrier 220, exceeds a predetermined time. If the detective unit 264 determines that the duration exceeds the predetermined time, the detective unit 264 triggers an abnormal event.

Figure 4A:
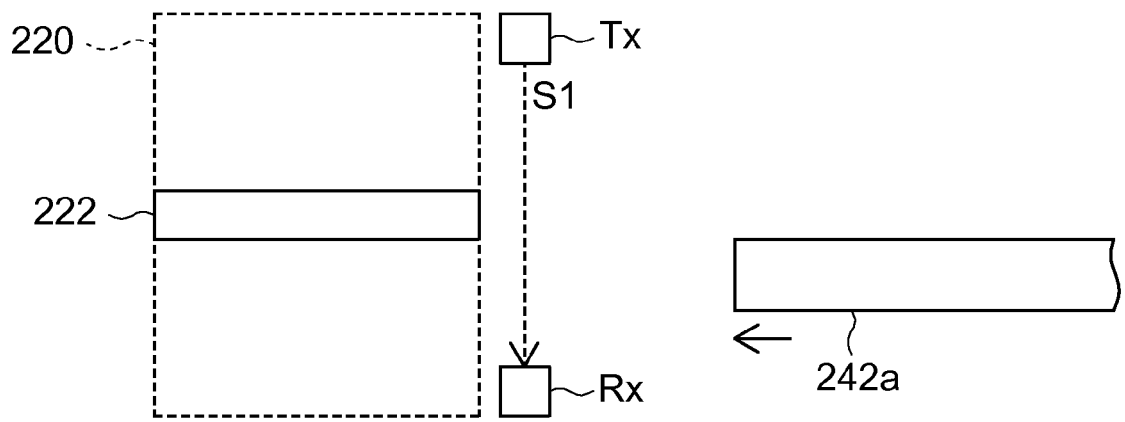
FIGS. 4A to 4C are side views showing the operation conditions of a transfer machine of FIG. 3A when the wafer is properly loaded, unloading, and unloaded respectively.
Figure 4B:
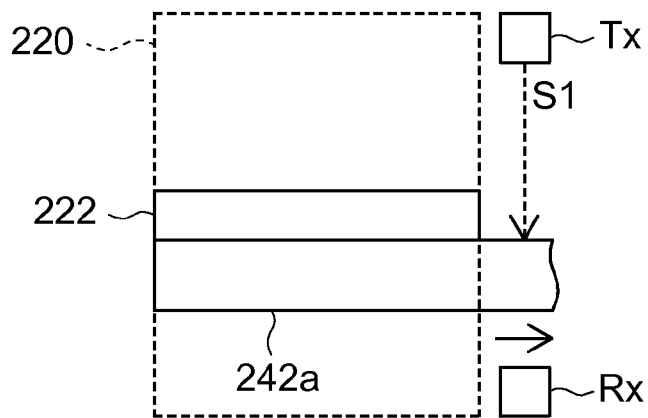
Figure 4C:
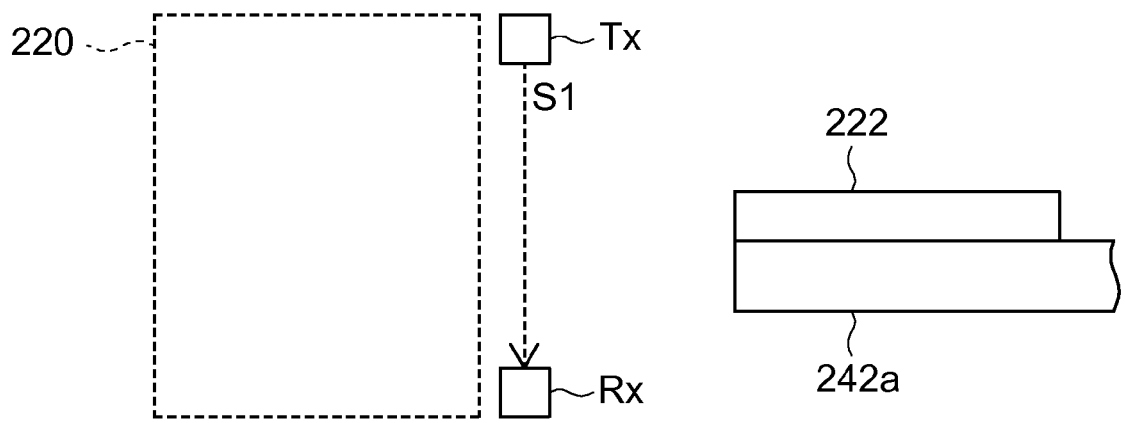

The predetermined time and the abnormal event will be described in an unload operation of wafer 222 in the following. FIGS. 4A to 4C are side views showing the operation conditions of the monitoring device 200 of FIG. 3A when the wafer 222 is properly loaded, unloading, and unloaded, respectively. When the transfer machine 240 properly loads the wafer 222, the sensing signal S1 will not be blocked, as shown in FIG. 4A. When the transfer machine 240 unloads the wafer 222, the sensing signal S1 is blocked by, for example, the robot 242a as shown in FIG. 4B, or blocked by the wafer 222 when the wafer 222 is on the robot 242a during the unload operation. Thereafter, the sensing signal S1 will return to the unblocked state when the wafer 222 is unloaded completely, as shown in FIG. 4C. Thus, the time, for which the transfer machine 240 unloads the wafer 222, may be set to be the predetermined time in the normal operation. Alternatively, the time for loading the wafer 222 may also be set to be the predetermined time.

When the detective unit 264 determines that the duration exceeds the predetermined time, it may represent that the wafer 222 may protrude from the front side SD of the carrier 220. For example, the wafer 222 may protrude from the front side SD of the carrier 220 before being unloaded, or the wafer 222 is not completely loaded into the carrier 220 and thus protrudes from the front side SD of the carrier 220. At this time, if the transfer machine 240 further loads or unloads the wafer 222, the wafer 222 may be damaged. Thus, when the detective unit 264 determines that the duration exceeds the predetermined time in the embodiment of the invention, the detective unit 264 triggers the abnormal event to represent that an abnormal operation occurs when the transfer machine 240 loads or unloads the wafer 222. The abnormal operation means that, as shown in the above-mentioned example, the wafer 222 is incorrectly carried in the carrier 220.

Furthermore, in the abnormal event, the detective unit 264 may further turn off the power of the controller 242b so that the robot 242a stops loading or unloading the wafer 222. In practice, the robot 242a is a pneumatic robot, for example, and the controller 242b controls the motion of the robot 242a by driving an air driver. Thus, the detective unit 264 can disable the air driver so that the robot 242a will stop operating. Consequently, it is possible to stop the transfer machine 240 from loading or unloading the wafer 222 protruding from the carrier 220, and thus to prevent the wafer 222 from being damaged.

In addition, in one practical example, the transfer machine 240 further moves the carrier 220 to motion the carrier 220 to an operation position. The operation position is the position where the transfer machine 240 can properly load or unload the wafer 222. The operation position may be, for example, the position of the carrier 220 depicted by the dashed lines of FIG. 4A. In this practical example, the monitoring device 200 of FIG. 2 may further include another sensing unit 266 for providing another sensing information, which is also exemplified by a sensing signal S2, to indicate whether the carrier 220 is positioned at the operation position. Thus, before the sensing unit 262 provides the sensing signal S1, the detective unit 264 may further determine whether the carrier 220 has been positioned at the operation position according to the sensing signal S2. If the carrier 220 has been positioned at the operation position, the detective unit 264 enables the sensing unit 262 so that the sensing unit 262 can provide the sensing signal S1.

Furthermore, the detective unit 264 may further include a time set 264a. The time set 264a may be configured to set the predetermined time. In addition, the detective unit 264 may further include a reset switch 264b for resetting the detective unit 264 in response to an external force. Thus, when the reset switch 264b resets the detective unit 264, the detective unit 264 turns on the power of the controller 242b, and performs the determining operation again (e.g., the steps S140 and S160 are performed again) according to the sensing signal S1. Thus, in the abnormal event caused by the wafer 222 which protrudes from the front side SD of the carrier 220, after the user positioned the wafer 222 to its proper position in the carrier 220, he or she can apply an external force to the reset switch 264b to reset the detective unit 264, and the monitoring device 200 will then return to the normal operation.

Figure 5:
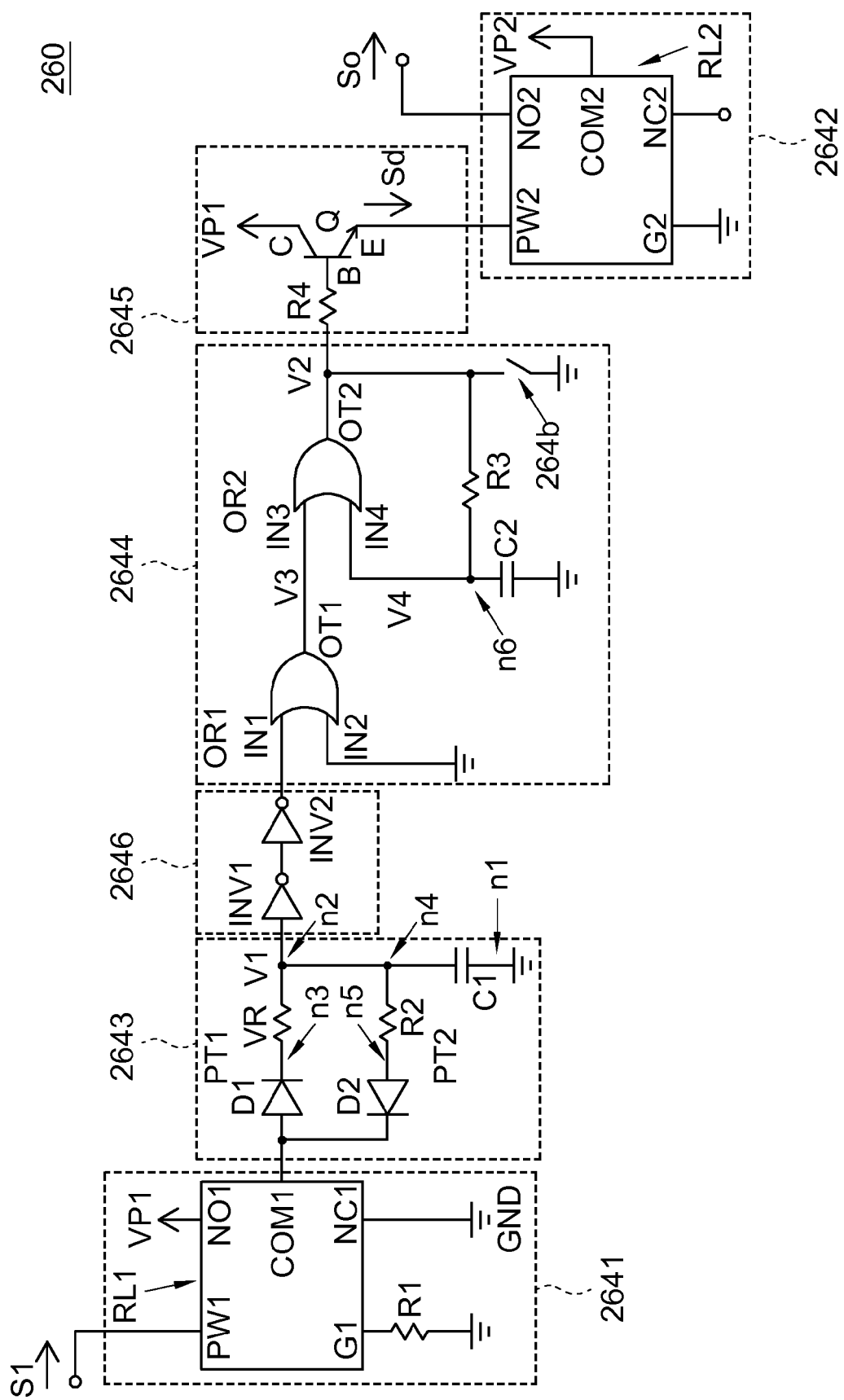
FIG. 5 is an example of a circuit diagram showing a monitoring circuit according to the embodiment of the invention.

The monitoring device 200 in this embodiment may be implemented by a monitoring circuit disclosed below. FIG. 5 is an example of a circuit diagram showing a monitoring circuit 260 according to the embodiment of the invention.

Referring to FIG. 5, the monitoring circuit 260 includes the sensing unit 262 (not shown in FIG. 5) and the detective unit 264. The detective unit 264 includes two controlling units (e.g. two voltage controllers 2641 and 2642), a setting unit (e.g. a storage 2643), an operating unit (e.g. a latch 2644), and a driving unit (e.g. a driver 2645).

The voltage controller 2641 receives a first detective voltage (e.g. a positive voltage VP1) and a second detective voltage (e.g. a ground voltage GND), and outputs one of the positive voltage VP1 and the ground voltage GND according to the voltage level of the sensing signal S1. The storage 2643 stores a first storing voltage V1. When the voltage controller 2641 outputs the positive voltage VP1, the storage 2643 receives the positive voltage VP1 to increase the level of the first storing voltage V1. When the voltage controller 2641 outputs the ground voltage GND, the storage 2643 receives the ground voltage GND to decrease the level of the first storing voltage V1.

The latch 2644 selectively enables latching and selectively provides a second storing voltage V2 according to the level of the first storing voltage V1. The driver 2645 is controlled by the second storing voltage V2 to provide a driving signal Sd. The voltage controller 2642 receives a third detective voltage (e.g. a positive voltage VP2), and selectively provides a warning signal So according to the voltage level of the driving signal Sd. The warning signal So has the voltage level of the positive voltage VP2.

The operation that the monitoring circuit 260 provides the warning signal So is described as follows. When the voltage controller 2641 outputs the positive voltage VP1 according to the sensing signal S1, the level of the first storing voltage V1 of the storage 2643 is increased. Then, the latch 2644 enables the latching and provides the second storing voltage V2 when the first storing voltage V1 is greater than a threshold value. Meanwhile, the driver 2645 will be controlled by the second storing voltage V2 and will provide the driving signal Sd having the high voltage level to drive voltage controller 2642, and the voltage controller 2642 will thus provide the warning signal So.

In detail, as shown in FIG. 5, the voltage controller 2641 includes a first load element (e.g. a first resistor R1) and a first control element (e.g. a relay RL1). The relay RL1 includes, for example, five pins corresponding to a power source terminal PW1, a ground terminal G1, a common terminal COM1, a normal-open terminal NO1 and a normal-close terminal NC1. The power source terminal PW1 receives the sensing signal S1. The ground G1 is coupled to the ground voltage GND via the first resistor R1. The normal-open terminal N01 receives the positive voltage VP1. The normal-close terminal NC1 receives the ground voltage GND. The common terminal COM1 outputs one of the positive voltage VP1 and the ground voltage GND.

When the sensing signal S1 has the first voltage level (e.g., the low voltage level), the relay RL1 may not be magnetized. So, the common terminal COM1 is electrically connected to the normal-close terminal NC1 so that the ground voltage GND is outputted from the common terminal COM1. When the sensing signal S1 has the second voltage level (e.g., the high voltage level), the relay RL1 is magnetized. So, the relay RL1 is driven by the sensing signal S1 so that the common terminal COM1 is electrically connected to the normal-open terminal NO1 and the positive voltage VP1 is outputted from the common terminal COM1.

The storage 2643 includes, for example, a first absorber element (e.g. a first capacitor C1), a charge path PT1 and a discharge path PT2. One end of the first capacitor C1 is coupled to the ground voltage GND, as shown by the terminal point n1. The first capacitor C1 stores the first storing voltage V1. The charge path PT1 includes a second load element (e.g. a variable resistor VR) and a first guiding element (e.g. a first diode D1). One end of the variable resistor VR is coupled to the other end of the capacitor C1, as shown by the terminal point n2. The first diode D1 is coupled to the other end of the variable resistor VR, as shown by the terminal point n3. The discharge path PT2 includes a third load element (e.g. a second resistor R2) and a second guiding element (e.g. a second diode D2). One end of the second resistor R2 is coupled to the other end of the first capacitor C1, as shown by the terminal point n4. The second diode D2 is coupled to the other end of the second resistor R2, as shown by the terminal point n5.

When the voltage controller 2641 outputs the positive voltage VP1, the first diode D1 is turned on, and the first capacitor C1 receives the positive voltage VP1 via the variable resistor VR to charge the first capacitor C1 and thus increase the level of the first storing voltage V1. When the voltage controller 2641 outputs the ground voltage GND, the second diode D2 is turned on, and the first capacitor C1 receives the ground voltage GND via the second resistor R2 so that the first capacitor C1 is discharged and the level of the first storing voltage V1 is decreased.

Furthermore, when the first capacitor C1 is charged via the variable resistor VR on the charge path PT1, the time constant for charging may be determined by the capacitance of the first capacitor C1 and the resistance of the variable resistor VR. So, it is obtained that the time constant for charging can be adjusted by changing the resistance of the variable resistor VR. Thus, the charge time of the first capacitor C1 can be adjusted by correspondingly designing the characteristics of the first capacitor C1 and the variable resistor VR. So, in the embodiment of FIG. 5, the function of setting unit, including first capacitor C1 and the variable resistor VR, may be substantially equivalent to the time set 264a of FIG. 2.

The latch 2644 includes a forth load element (e.g. a third resistor R3), a second absorber element (e.g. a second capacitor C2), a first logical gate (e.g. an OR gate OR1) and a second logical gate (e.g. an OR gate OR2). The third resistor R3 and the second capacitor C2 are connected in series. The first OR gate OR1 includes an input terminal IN1, an input terminal IN2 and an output terminal OT1. The input terminal IN1 receives the first storing voltage V1. The input terminal IN2 is coupled to the ground voltage GND. The output terminal OT1 outputs a third storing voltage V3 according to the level of the first storing voltage V1. The second OR gate OR2 includes an input terminal IN3, an input terminal IN4 and an output terminal OT2. The input terminal IN3 receives the third storing voltage V3. The input terminal IN4 receives a fourth storing voltage V4. The output terminal OT2 outputs the second storing voltage V2 according to the voltage levels of the third storing voltage V3 and the fourth storing voltage V4. The output terminal OT2 is coupled to the ground voltage GND via the third resistor R3 and the second capacitor C2 connected in series, so that the fourth storing voltage V4 is generated at a serial connection terminal n6 between the third resistor R3 and the second capacitor C2 and is fed back to the input terminal IN4.

In FIG. 5, the detective unit 264 further includes a buffer 2646. The buffer 2646 includes two inverse gates INV1 and INV2 connected in series. The latch 2644 receives the first storing voltage V1 via the two inverse gates INV1 and INV2. When the first storing voltage V1 is higher than the threshold value, such as the voltage value capable of enabling the first OR gate OR1 to enter the operation state, the first OR gate OR1 outputs the third storing voltage V3 having the high voltage level, and the second OR gate OR2 outputs the second storing voltage V2 having the high voltage level and generates the fourth storing voltage V4 having the high voltage level so that the latch 2644 enables the latching and provides the second storing voltage V2.

Furthermore, the detective unit 264 may further include the above-mentioned reset switch 264b, which is coupled to the output terminal OT2, and couples the second capacitor C2 to the ground voltage GND in response to the external force. Thus, the level of the fourth storing voltage V4 is decreased and the latching of the latch 2644 is disabled so that the second storing voltage V2 is no longer provided.

The driver 2645 includes a fifth load element (e.g. a fourth resistor R4) and a switch element (e.g. a transistor Q). The transistor Q includes three terminals corresponding to a base B, a collector C and an emitter E. The base B receives the second storing voltage V2 via the fourth resistor R4. The collector C is coupled to the positive voltage VP1. The emitter E outputs the driving signal Sd. When the second storing voltage V2 has the high voltage level, the transistor Q provides the driving signal Sd having the high voltage level.

The voltage controller 2642 includes a second control element (e.g. a relay RL2). Also, the relay RL2 includes, for example, five pins corresponding to a power source terminal PW2, a ground terminal G2, a common terminal COM2, a normal-open terminal N02 and a normal-close terminal NC2. The power source terminal PW2 receives the driving signal Sd. The ground G2 is coupled to the ground voltage GND. The common terminal COM2 receives the positive voltage VP2. The normal-open terminal NO2 selectively provides the warning signal So. The normal-close terminal NC2 may be floating, and or may be used in other applications. When the relay RL2 is driven by the driving signal Sd having the high voltage level, the relay RL1 is magnetized so as to provide the warning signal So from the normal-open terminal N02.

Consequently, in the circuit diagram of FIG. 5, when the wafer protrudes from the carrier, the voltage level of the sensing signal S1 is changed, and the monitoring circuit 260 can transmit the electric signal according to the change of the voltage level of the sensing signal S1 in order to generate the above-mentioned warning signal So. Thus, it is possible to stop the transfer machine from loading or unloading the wafer according to the warning signal So. Consequently, it is possible to prevent the wafer from being damaged.

Besides, in another embodiment, the operating unit may be implemented by a count alternatively. The count is used for counting the time period on which the first storing voltage V1 being higher than the threshold value, and thus to selectively enable latching and selectively provides the second storing voltage V2.

In another embodiment, the control element may be implemented by a comparator alternatively. For example, the first controlling element can be implemented by a comparator. The comparator is used for comparing the level of the first sensing information with a predetermined voltage, and thus to determine which one of the first detective voltage and the second detective voltage is to be outputted. Similarly, the second controlling element can also be implemented by another comparator without detailing herein.

In another embodiment, the absorber element may be implemented by a Metal-Oxide-Semiconductor Field-Effect Transistor (MOSFET) alternatively, and the guiding element may be implemented by an MOSFET alternatively.

In the above-mentioned embodiments, the way for implementing the elements of the monitoring circuit is for illustration, and this invention should not be limited thereto.

In the monitoring circuit, the monitoring device for monitoring an abnormal load or unload operation of the wafer, and the monitoring method thereof according to the embodiment of the invention, the sensing information is provided to indicate whether the wafer protrudes from one side of the carrier, and it is determined whether the duration, during which the wafer protrudes from the side of the carrier, exceeds the predetermined time, for which the transfer machine loads or unloads the wafer according to the sensing signal. Thus, it is possible to trigger the abnormal event to indicate that the transfer machine abnormally loads or unloads the wafer when the wafer protrudes from the side of the carrier. Furthermore, it is also possible to stop the machine from loading or unloading the wafer in this abnormal event to prevent the wafer from being damaged.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A monitoring device for monitoring an abnormal load or unload operation of a wafer, the monitoring device comprising:
   a first sensing unit for providing a first sensing information, which indicates whether the wafer protrudes from a side of a carrier; and
   a detecting unit for determining whether a duration, for which the wafer protrudes from the side of the carrier, exceeds a predetermined time, for which the wafer is loaded or unloaded, according to the first sensing information, and further triggering an abnormal event if the duration exceeds the predetermined time, wherein the detecting unit comprises:
   a first controlling unit for outputting a detective voltage according to a voltage level of the first sensing information;
   a setting unit for storing a first storing voltage, and adjusting a level of the first storing voltage according to the detective voltage;
   an operating unit for selectively enabling latching and selectively providing a second storing voltage according to a level of the first storing voltage;
   a driving unit controlled by the second storing voltage to provide a driving signal; and
   a second controlling unit for selectively providing a warning signal according to a voltage level of the driving signal.

2. The monitoring device according to claim 1, wherein the detecting unit comprises:
   a time set for setting the predetermined time.

3. The monitoring device according to claim 1, further comprising:
   a transfer machine comprising a controller and a robot, wherein the robot is for loading or unloading the wafer under control of the controller;
   wherein when the detecting unit triggers the abnormal event, the detecting unit further turns off the power of the controller to make the robot stop loading or unloading the wafer.

4. The monitoring device according to claim 3, wherein the detecting unit comprises:
   a reset switch for resetting the detecting unit in response to an external force, wherein when the reset switch resets the detecting unit, the detecting unit turns on the power of the controller, and determines whether the duration exceeds the predetermined time again according to the first sensing information.

5. The monitoring device according to claim 3, wherein the transfer machine is further for motioning the carrier to position the carrier at an operation position where the transfer machine can load or unload the wafer, and the monitoring device further comprising:
a second sensing unit for providing a second sensing information, which indicates whether the carrier has been positioned at the operation position;
wherein before the first sensing unit provides the first sensing information, the detecting unit is further for determining whether the carrier has been positioned at the operation position according to the second sensing information, and for enabling the first sensing unit to provide the first sensing information if the carrier has been positioned at the operation position.

6. The monitoring device according to claim 1, wherein the first sensing information is a sensing signal.

7. A method for monitoring whether an abnormal operation occurs when a transfer machine loads or unloads a wafer from one side of a carrier, the method comprising the steps of:
providing a first sensing information, which indicates whether the wafer protrudes from the side of the carrier; and
determining whether a duration, for which the wafer protrudes from the side of the carrier, exceeds a predetermined time, for which the wafer is loaded or unloaded, according to the first sensing information, and triggering an abnormal event if the duration exceeds the predetermined time, wherein the step of determining whether a duration for which the wafer protrudes from the side of the carrier exceeds a predetermined time for which the wafer is loaded or unloaded according to the first sensing information and triggering an abnormal event if the duration exceeds the predetermined time comprises:
outputting a detective voltage according to a voltage level of the first sensing information;
storing a first storing voltage, and adjusting a level of the first storing voltage according to the detective voltage;
selectively enabling latching and selectively providing a second storing voltage according to a level of the first storing voltage;
providing a driving signal according to the second storing voltage; and
selectively providing a warning signal according to a voltage level of the driving signal.

8. The method according to claim 7, further comprising the step of:
setting the predetermined time by a time set.

9. The method according to claim 7, wherein the transfer machine comprises a controller and a robot, the robot is for loading or unloading the wafer under control of the controller, and the step of triggering the abnormal event comprises the step of:
turning off the power of the controller to make the robot stop loading or unloading the wafer.

10. The method according to claim 9, further comprising, after the step of turning off the power of the controller, the step of:
turning on the power of the controller to perform the step of determining whether the duration exceeds the predetermined time again in response to an external force.

11. The method according to claim 7, wherein the transfer machine is further for motioning the carrier to position the carrier at an operation position where the transfer machine can load or unload the wafer, and the method further comprises, before the step of providing the first sensing information, the steps of:
providing a second sensing information, which indicates whether the carrier has been positioned at the operation position; and
determining whether the carrier has been positioned at the operation position according to the second sensing information, and performing the step of providing the first sensing information if the carrier has been positioned at the operation position.

12. The method according to claim 7, wherein the first sensing information is a sensing signal.

13. A monitoring circuit for monitoring an abnormal load or unload operation of a wafer, the monitoring circuit comprising:
a first sensing unit for providing a first sensing information, which indicates whether the wafer protrudes from a side of a carrier; and
a detecting unit for determining whether a duration, for which the wafer protrudes from the side of the carrier, exceeds a predetermined time, for which the wafer is loaded or unloaded, according to the first sensing information, and further triggering an abnormal event if the duration exceeds the predetermined time, wherein the detecting unit comprises:
a first controlling unit for receiving a first detective voltage and a second detective voltage, and outputting one of the first detective voltage and the second detective voltage according to a voltage level of the first sensing information;
a setting unit for storing a first storing voltage, wherein the setting unit receives the first detective voltage and increases the level of the first storing voltage when the first controlling unit outputs the first detective voltage, and the setting unit receives the second detective voltage and decreases the level of the first storing voltage when the first controlling unit outputs the second detective voltage;
an operating unit for selectively enabling latching and selectively providing a second storing voltage according to the level of the first storing voltage;
a driving unit controlled by the second storing voltage to provide a driving signal; and
a second controlling unit for receiving a third detective voltage, and selectively providing a warning signal, which has a voltage level of the third detective voltage, according to a voltage level of the driving signal, wherein:
when the first controlling unit outputs the first detective voltage according to the first sensing information, which increases the level of the first storing voltage of the setting unit and causes the first storing voltage to be higher than a threshold value, the operating unit enables the latching and provides the second storing voltage, and the driving unit provides the driving signal having a high voltage level to drive the second controlling unit under control of the second storing voltage, so as to enable the second controlling unit to provide the warning signal.

14. The monitoring circuit according to claim 13, wherein the first controlling unit comprises a first load element and a first control element, the first control element comprises:
a first terminal for receiving the first sensing information;
a second terminal coupled to the second detective voltage via the first load element;
a third terminal for receiving the first detective voltage;

a fourth terminal for receiving the second detective voltage; and
a fifth terminal for outputting the one of the first detective voltage and the second detective voltage, wherein:
when the first sensing information has a first voltage level, the fifth terminal is electrically connected to the fourth terminal so that the second detective voltage is outputted from the fifth terminal; and
when the first sensing information has a second voltage level, the first control element is driven by the first sensing information to electrically connect the fifth terminal to the third terminal so that the first detective voltage is outputted from the fifth terminal.

15. The monitoring circuit according to claim 14, wherein the first load element is implemented by a resistor and the first control element is implemented by a relay.

16. The monitoring circuit according to claim 14, wherein the first control element is implemented by a comparator.

17. The monitoring circuit according to claim 13, wherein the setting unit comprises:
a first absorber element for storing the first storing voltage and having one end coupled to the second detective voltage;
a charge path, which comprises:
a second load element having one end coupled to the other end of the first absorber element; and
a first guiding element coupled to the other end of the second load element; and
a discharge path, which comprises:
a third load element having one end coupled to the other end of the first absorber element; and
a second guiding element coupled to the other end of the third load element;
wherein when the first controlling unit outputs the first detective voltage, the first guiding element is turned on, and the other end of the first absorber element receives the first detective voltage via the second load element so that the first absorber element is charged to increase the level of the first storing voltage; and
when the first controlling unit outputs the second detective voltage, the second guiding element is turned on, and the other end of the first absorber element receives the second detective voltage via the third load element so that the first absorber element is discharged to decrease the level of the first storing voltage.

18. The monitoring circuit according to claim 17, wherein the first absorber element is implemented by a capacitor and the guiding elements are implemented by diodes.

19. The monitoring circuit according to claim 17, wherein the first absorber element is implemented by a Metal-Oxide-Semiconductor Field-Effect Transistor (MOSFET) and each of the guiding elements is implemented by an MOSFET.

20. The monitoring circuit according to claim 17 wherein the operating unit comprises:
a fourth load element and a second absorber element connected in series;
a first logical gate, which comprises:
a first input terminal for receiving the first storing voltage;
a second input terminal coupled to the second detective voltage; and
a first output terminal for outputting a third storing voltage according to the level of the first storing voltage; and
a second logical gate, which comprises:
a third input terminal for receiving the third storing voltage;
a fourth input terminal for receiving a fourth storing voltage; and
a second output terminal for outputting the second storing voltage according to voltage levels of the third storing voltage and the fourth storing voltage, wherein the second output terminal is coupled to the second detective voltage via the fourth load element and the second absorber element connected in series so that the fourth storing voltage is generated at a serial connection terminal between the fourth load element and the second absorber element, and the fourth storing voltage is fed back to the fourth input terminal,
wherein when the first storing voltage is higher than the threshold value capable of enabling the first logical gate to enter an operation state, the first logical gate outputs the third storing voltage having a high voltage level, and the second logical gate outputs the second storing voltage having a high voltage level and generates the fourth storing voltage having a high voltage level so that the operating unit enables latching and provides the second storing voltage.

21. The monitoring circuit according to claim 20, further comprising:
a reset switch, coupled to the second output terminal, for coupling the second absorber element to the second detective voltage in response to an external force so that the level of the fourth voltage is decreased and the latching of the operating unit is thus disabled.

22. The monitoring circuit according to claim 20, wherein the driving unit comprises:
a fifth load element; and
a switch element, which comprises:
a first terminal for receiving the second storing voltage via the fifth load element;
a second terminal coupled to the first detective voltage; and
a third terminal for outputting the driving signal,
wherein when the second storing voltage has a high voltage level, the switch element provides the driving signal having a high voltage level.

23. The monitoring circuit according to claim 22, wherein the switch element is implemented by a transistor.

24. The monitoring circuit according to claim 13, wherein the second controlling unit comprises a second control element, which comprises:
a first terminal for receiving the driving signal;
a second terminal coupled to the second detective voltage;
a third terminal for selectively providing the warning signal,
a fourth terminal for receiving the third detective voltage; and
wherein the second control element is driven by the driving signal having a high voltage level to provide the warning signal from the third terminal.

25. The monitoring circuit according to claim 13, wherein the detecting unit further comprises a buffer, which comprises:
a first inverse gate and a second inverse gate connected in series,
wherein the operating unit receives the first storing voltage via the first inverse gate and the second inverse gate.

26. The monitoring circuit according to claim 13, wherein the controlling units are implemented by voltage controllers.

27. The monitoring circuit according to claim 13, wherein the operating unit is implemented by a latch.

28. The monitoring circuit according to claim 13, wherein the operating unit is implemented by a count.

29. The monitoring circuit according to claim 13, wherein the sensing information is a sensing signal.

* * * * *